US010970041B2

(12) United States Patent
Meredith et al.

(10) Patent No.: US 10,970,041 B2
(45) Date of Patent: *Apr. 6, 2021

(54) ANALOG SORTER

(71) Applicants: AT&T Mobility II LLC, Atlanta, GA (US); AT&T Intellectual Property I, L.P., Atlanta, GA (US)

(72) Inventors: Sheldon K. Meredith, Roswell, GA (US); William C. Cottrill, Canton, GA (US)

(73) Assignees: AT&T Intellectual Property I, L.P., Atlanta, GA (US); AT&T Mobility II LLC, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/569,952

(22) Filed: Sep. 13, 2019

(65) Prior Publication Data

US 2020/0004501 A1 Jan. 2, 2020

Related U.S. Application Data

(63) Continuation of application No. 14/924,005, filed on Oct. 27, 2015, now Pat. No. 10,416,959.

(51) Int. Cl.
*H03M 1/66* (2006.01)
*G06F 7/22* (2006.01)
*H03M 1/10* (2006.01)
*H03M 1/12* (2006.01)
*H03M 1/46* (2006.01)

(52) U.S. Cl.
CPC ............ *G06F 7/22* (2013.01); *H03M 1/1071* (2013.01); *H03M 1/12* (2013.01); *H03M 1/46* (2013.01); *H03M 1/66* (2013.01)

(58) Field of Classification Search
CPC ............ H03M 1/46; H03M 1/66; H03M 1/12; H03M 1/1071; H03M 1/48
USPC ........................................ 341/142, 144, 151
See application file for complete search history.

(56) References Cited

U.S. PATENT DOCUMENTS

| | | | |
|---|---|---|---|
| 3,931,612 A | 1/1976 | Stevens et al. | |
| 4,030,077 A | 6/1977 | Florence et al. | |
| 4,132,314 A | 1/1979 | von Beckmann et al. | |
| 4,298,957 A | 3/1981 | Duvall et al. | |
| 4,261,034 A | 4/1981 | Saccomano | |

(Continued)

OTHER PUBLICATIONS

Choi, Sung-Soon and Moon, Byung-Ro, "Isomorphism, Normalization, and a Genetic Algorithm for Sorting Network Optimization," Proceedings of the Genetic and Evolutionary Computation, Gecco, 2002, pp. 327-334.

(Continued)

*Primary Examiner* — Linh V Nguyen
(74) *Attorney, Agent, or Firm* — Guntin & Gust, PLC; John G. Rauch

(57) ABSTRACT

A list of digital elements to be sorted are converted to a group of analog signals. The group of analog signals are simultaneously compared to each other to determine the largest analog signal in the group. The largest analog signal is then compared to each of the analog signals in the group to determine which one or more of the analog signals in the group matches the largest analog signal. The matching one or more of the analog signals is removed from the group and the process is repeated until the group of analog signals have been sorted.

20 Claims, 6 Drawing Sheets

(56) References Cited

U.S. PATENT DOCUMENTS

| | | | |
|---|---|---|---|
| 4,464,732 A | 8/1984 | Clark | |
| 4,750,149 A | 6/1988 | Miller | |
| 4,907,186 A | 3/1990 | Racey | |
| 4,939,639 A | 7/1990 | Lee et al. | |
| 5,179,699 A | 1/1993 | Iyer et al. | |
| 5,218,700 A | 6/1993 | Beechick | |
| 5,600,825 A | 2/1997 | Atkins et al. | |
| 5,684,482 A * | 11/1997 | Galton | H03M 1/0668 341/144 |
| 5,905,387 A | 5/1999 | Chinosi et al. | |
| 5,917,828 A | 6/1999 | Thompson | |
| 5,986,595 A * | 11/1999 | Lyden | H03M 1/0668 341/118 |
| 6,073,128 A | 6/2000 | Pongracz | |
| 6,188,251 B1 | 2/2001 | Priemer et al. | |
| 6,198,311 B1 | 3/2001 | Shi et al. | |
| 6,199,084 B1 | 3/2001 | Wiseman | |
| 6,289,509 B1 | 9/2001 | Kryloff | |
| 6,310,740 B1 | 10/2001 | Dunbar | |
| 6,366,911 B1 | 4/2002 | Christy | |
| 6,741,999 B2 | 5/2004 | Wagner | |
| 6,757,766 B1 | 6/2004 | Hutner et al. | |
| 6,775,667 B1 | 8/2004 | Lewis | |
| 7,092,901 B2 | 8/2006 | Davis et al. | |
| 7,177,319 B2 | 2/2007 | Buchert et al. | |
| 7,197,498 B2 | 3/2007 | Perloff | |
| 7,233,895 B2 | 6/2007 | Petty | |
| 7,277,606 B1 * | 10/2007 | Sakai | G02B 6/359 385/17 |
| 7,450,588 B2 | 11/2008 | Chang et al. | |
| 7,467,138 B2 | 12/2008 | Carroll | |
| 7,689,541 B1 | 3/2010 | Le Grand | |
| 7,711,603 B2 | 5/2010 | Vanker | |
| 7,796,583 B1 | 9/2010 | Enderby | |
| 7,870,159 B2 | 1/2011 | Carroll | |
| 7,975,120 B2 | 7/2011 | Sabbatini, Jr. et al. | |
| 8,014,270 B2 | 9/2011 | Halford et al. | |
| 8,094,157 B1 | 1/2012 | Le Grand | |
| 8,098,718 B2 | 1/2012 | Sienko et al. | |
| 8,223,055 B2 * | 7/2012 | Hochschild | H03M 1/0668 341/144 |
| 8,239,231 B2 | 8/2012 | Lian | |
| 8,407,098 B2 | 3/2013 | Davydov | |
| 8,700,614 B1 | 4/2014 | Diller et al. | |
| 8,704,842 B1 | 4/2014 | Gaddy et al. | |
| 8,832,115 B2 | 9/2014 | Smintina et al. | |
| 8,964,771 B2 | 2/2015 | Tabatabaee et al. | |
| 9,106,238 B1 * | 8/2015 | Cronie | H03M 7/00 |
| 9,377,854 B2 | 6/2016 | Raffa | |
| 10,261,832 B2 | 4/2019 | Meredith et al. | |
| 10,296,612 B2 * | 5/2019 | Meredith et al. | |
| 10,416,959 B2 * | 9/2019 | Meredith | G06F 7/22 |
| 2002/0040362 A1 | 4/2002 | Lewis | |
| 2002/0165707 A1 | 7/2002 | Call | |
| 2002/0174222 A1 | 11/2002 | Cox | |
| 2002/0190884 A1 | 12/2002 | Yu | |
| 2003/0061061 A1 | 3/2003 | Curtis | |
| 2005/0052297 A1 * | 3/2005 | Eloranta | H03M 1/0651 341/120 |
| 2005/0193174 A1 | 9/2005 | Arimilli | |
| 2006/0123014 A1 | 6/2006 | Ng | |
| 2006/0176901 A1 | 8/2006 | Terai et al. | |
| 2007/0174124 A1 | 7/2007 | Zagofsky et al. | |
| 2007/0279274 A1 | 12/2007 | Hsieh | |
| 2008/0048641 A1 * | 2/2008 | Makino | G01R 19/04 324/103 P |
| 2008/0208951 A1 | 8/2008 | Gotz | |
| 2008/0211544 A1 * | 9/2008 | Makino | G01R 19/04 327/59 |
| 2008/0215584 A1 | 9/2008 | Furusho | |
| 2009/0103501 A1 | 4/2009 | Farrag | |
| 2009/0163223 A1 | 6/2009 | Casey | |
| 2009/0302232 A1 | 12/2009 | Grosholz, Jr. | |
| 2010/0031003 A1 | 2/2010 | Chen | |
| 2010/0312995 A1 | 12/2010 | Sung | |
| 2011/0093546 A1 | 4/2011 | Rubingh | |
| 2013/0207819 A1 | 8/2013 | Banarie | |
| 2013/0314101 A1 | 11/2013 | Belet | |
| 2013/0346425 A1 | 12/2013 | Bruestle | |
| 2014/0006665 A1 | 1/2014 | Amano | |
| 2014/0164652 A1 | 6/2014 | Pettijohn | |
| 2014/0266487 A1 | 9/2014 | Vaishnav | |
| 2014/0269684 A1 | 9/2014 | Fortune | |
| 2014/0281390 A1 | 9/2014 | Boland et al. | |
| 2015/0134795 A1 | 5/2015 | Theimer et al. | |
| 2015/0169585 A1 | 6/2015 | Korst et al. | |
| 2017/0161020 A1 | 6/2017 | Meredith et al. | |
| 2017/0325065 A1 | 9/2017 | Azam et al. | |

OTHER PUBLICATIONS

Dewdney, A.K., "Computer Recreations—On the Spaghetti Computer and Other Analog Gadgets for Problem Solving," Scientific American, pp. 19-26, Jun. 1984.

Rovetta, S. and Zunino, R., "Minimal-connectivity circuit for analogue sorting," IEE Proc.-Circuits Devices Syst., vol. 146, No. 3, Jun. 1999, pp. 108-110.

Xing, Huanlai and Qu, Rong, "A Nondominated Sorting Genetic Algorithm for Bi-Objective Network Coding Based multicast Routing Problems," Information Sciences, 233 (2013), pp. 23 pages.

* cited by examiner

ANALOG SORTER

CROSS-REFERENCE TO RELATED APPLICATIONS

This application is a continuation of U.S. patent application Ser. No. 14/924,005, filed Oct. 27, 2015, entitled "Analog Sorter," naming Sheldon K. Meredith and William C. Cottrill as inventors, which application is incorporated herein by reference in its entirety.

BACKGROUND

Field of the Invention

This application relates to sorting and more particularly to sorting using analog signals.

Description of the Related Art

The widely accepted value for the minimum number of comparison operations to sort a large list of N items is N log 2(N). A very large list of one billion items, for example, requires roughly 30 billion comparisons. Each of those comparisons can also require many clock cycles of the computing system. 30 billion comparisons might actually take 300 billion clocked operations. In Big Data analytics, weather prediction, nuclear calculations, astrophysics, genetics, public health, and many other disciplines, there is a frequent need to sort very large datasets. That suggests the need for computational resources that can literally fill buildings with racks of servers to perform such sorts. To the extent one can improve on this N log 2(N) limitation, one can improve on the capital infrastructure and associated operational costs for computing systems.

SUMMARY OF EMBODIMENTS OF THE INVENTION

In an embodiment, an apparatus includes a plurality of list element blocks. Each list element block includes a digital storage to store a digital element value, a digital-to-analog converter to convert the digital element value to an analog value, and an analog comparator to compare the analog value to a peak analog value and supply a match signal indicative thereof. A peak detect and hold circuit is coupled to receive analog values from the element blocks and to determine a peak analog value therefrom and to supply the peak analog value to the analog comparators of the element blocks.

In another embodiment, a method includes converting a plurality of list elements to be compared to respective analog signals. The respective analog signals are compared to determine a largest analog signal. The largest analog signal is compared to the respective analog signals to determine which one or more of the respective analog signals matches the largest analog signal. The one or more of the respective analog signals that match the first largest analog signal is removed to generate remaining analog signals. The remaining analog signals are compared to determine a second largest analog signal. The second largest analog signal is compared to the remaining analog signals to determine which one or more of the remaining analog signals matches the second largest analog signal. The one or more of the remaining analog signals that match the second largest analog signal is removed to generate second remaining analog signals.

In another embodiment a method includes simultaneously comparing a group of analog signals. Based on the comparing, one of the analog signals in the group is selected. One or more matches is determined by comparing the selected one of the analog signals to each of the analog signals of the group to determine which one or more of the analog signals matches the selected one of the analog signals. The one or more of the analog signals that match is removed from the group. The simultaneously comparing, selecting, and determining are repeated until all the analog signals of the group have been sorted.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

An electronic hardware apparatus is disclosed that receives a list of numeric values from a computer system and then sorts the list in a manner roughly described as "N-operations" using an analog sorting approach. The analog sort operation can be thought of as follows. Envision having N pieces of hard spaghetti noodles of varying lengths, each length representing a different value. To sort them from longest to shortest is simply a matter of bundling all the spaghetti together, flattening them on a table and then lowering your hand from above until you encounter the tallest one. Then you simply remove the tallest one and repeat the process until all the spaghetti noodles have been sorted.

In order to implement this "spaghetti sort" concept, in an embodiment, each digital list element is converted to an analog signal, such as a voltage, that corresponds to the value of the list element. The voltages corresponding to the values of the list elements are simultaneously compared to determine the largest (peak) voltage among the various voltages. Then each voltage is simultaneously compared to the peak voltage and when a match occurs, that match identifies the current largest value. The current largest value is removed from the elements to be sorted and the process repeats, identifying the largest to smallest. There is no need to compare pairs of values to each other as is typical in other sorting schemes.

Figure 1:
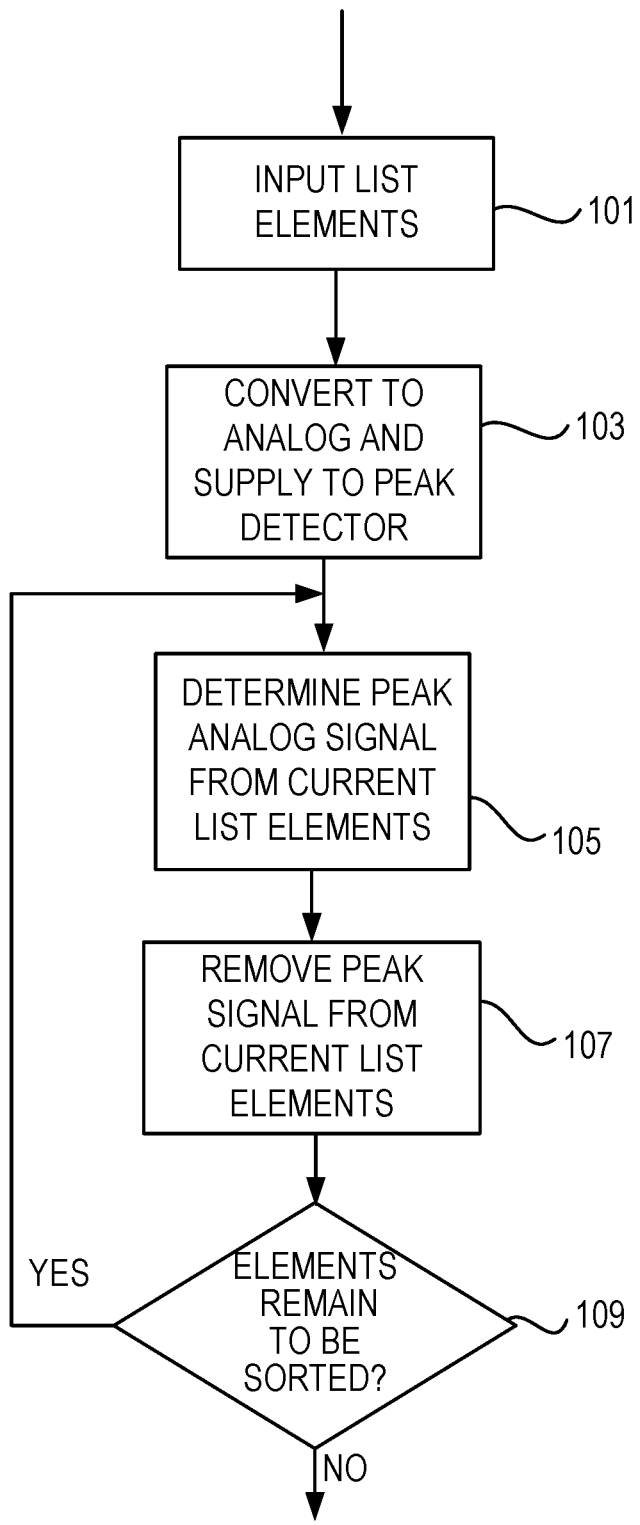
FIG. 1 shows a high level flow diagram of an analog sort operation.

FIG. 1 illustrates a high level flow diagram of an embodiment. In 101, the elements of the list are input into the apparatus. Each element of the list is converted to an analog signal in 103 having a magnitude corresponding to the value of list element and all of the analog signals are simultaneously applied to a peak detector circuit. In 105 the peak detector circuit determines the peak voltage (corresponding to the longest piece of spaghetti). The largest element in the list, having the largest voltage is removed in 107, and a check is made in 109 to determine if all the elements of the list have been sorted i.e., one or fewer list elements remain. If there are still list elements to sort, the flow returns to 105, where the remaining analog list elements are compared to determine the next largest element and that element is removed from the list. If in 109 the last list element has been sorted, the sort is complete.

Figure 2:
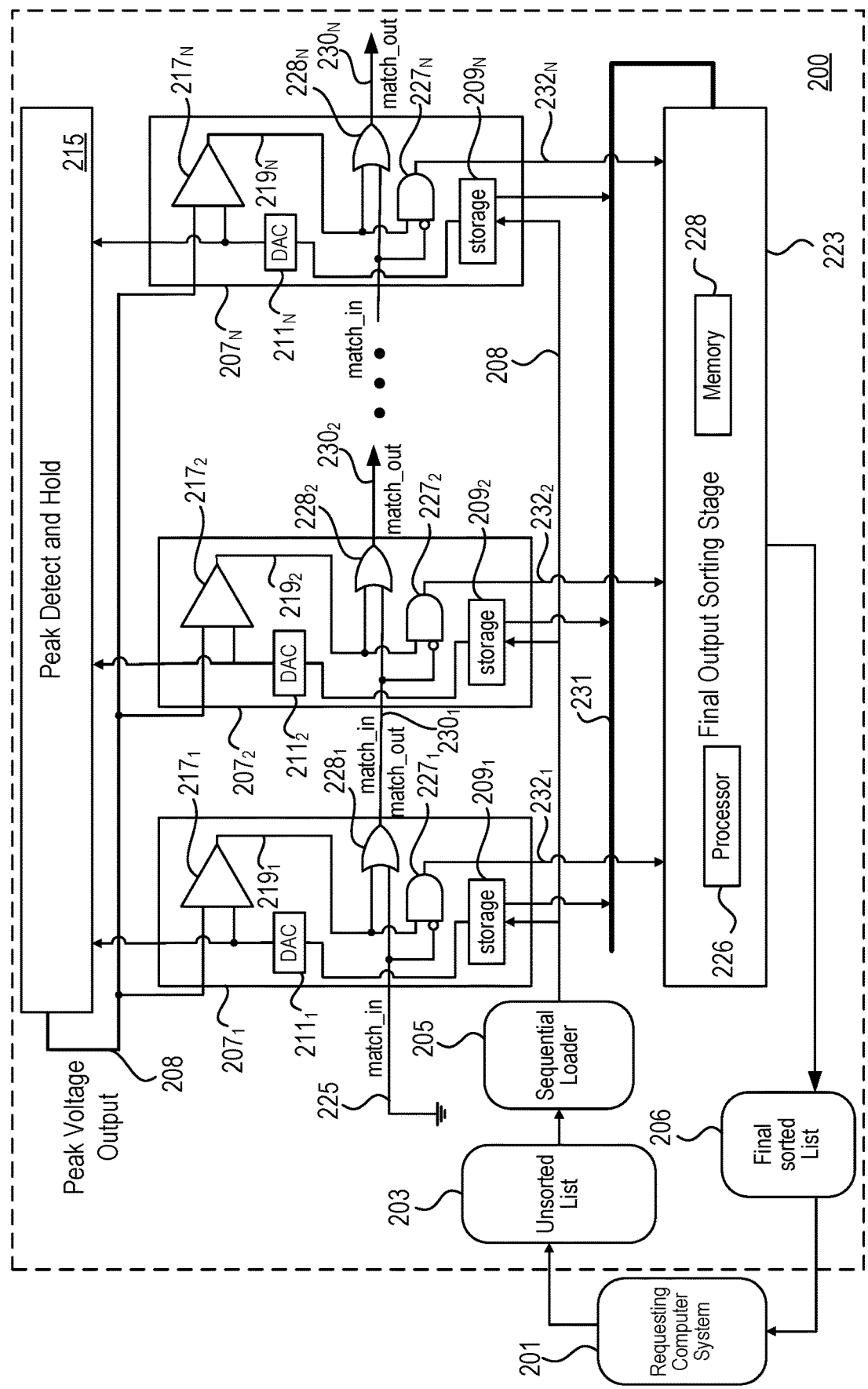
FIG. 2 illustrates an embodiment of an analog sorter.

FIG. 2 illustrates a sorter 200 according to an embodiment. A requesting computer system 201 supplies an unsorted list 203 to the sorting apparatus 200. The requesting computer system 201 receives back a final sorted output list 206. The unsorted list 203 may be stored in memory in sorting apparatus 200. Sequential loader 205, which may be implemented, e.g., as a programmed processor with memory to store software to implement the load functionality or as other appropriate control logic, loads the elements of the assigned list into respective element blocks 207 ($207_1$-$207_N$). There is an element block for each element in the list to be sorted. Each element block includes digital and analog logic to implement aspects of the sort. Element block $207_1$ will be described and the other element blocks are similar or identical.

Element block $207_1$ receives the first element of the list from the communication bus 208 and stores the element value in storage $209_1$. The value of the element is represented digitally. As list elements are input into the apparatus, the digital value of each element is stored in a separate memory register 209 ($209_1$-$209_N$). In an embodiment, as described further herein, only the 14-16 most significant bits of information are used to produce a voltage from each element value. Of course, the values could be represented in other than binary format, but ultimately are still converted into voltages. The storage $209_1$ supplies the digital value to a digital to analog converter (DAC) $211_1$. The DAC $211_1$ converts the digital value to an analog value and supplies the analog value to peak detect and hold circuit 215. Once all of the storages 209 ($209_1$-$209_N$) of the element blocks 207 have been loaded and all of the DACs 211 ($211_1$-$211_N$) have converted their digital representation of the list element to an analog representation of the list element, the peak detect and hold circuit 215 determines the largest voltage value supplied from the digital to analog converters 211.

In an embodiment DACs 211 convert to voltages. Peak detect and hold circuit 215 determines the largest voltage and stores the largest analog value so it can be supplied to comparators 217 ($217_1$-$217_N$). Each element block compares its own voltage from DAC 211 to the peak voltage in comparators 217 ($217_1$-$217_N$). If the voltages are the same, then the comparators 217 assert a match signal 219 ($219_1$-$219_N$) thereby indicating that the value of the list element being processed by element block $207_1$ is the largest element, or the largest remaining element, in the list. Matches are reported to the final output sorting stage 223, whose operation is described further herein.

Since multiple element blocks can have the same element value and thus a voltage match, multiple element blocks may want to simultaneously report a match to the final output sorting stage 223. That can potentially result in collisions when reporting matches. There are several ways to report matches from multiple element blocks to address the possibility of collisions. For example, assume each of the element blocks is identified by an address or other identification (ID). On one side of the element block (such as registers with lower ID numbers) each element block performs a logical OR operation on its own match signal 219 with the match_in signal from an adjacent element block. That logic is represented by OR gates 228 ($228_1$-$228_N$) and allows the match signals to cascade sequentially to all interconnected element blocks. Consider the very first element block $207_1$. Since there are no lower numbered element blocks, when element block $207_1$ has a match, its input match_in 225, which is tied to ground, is desasserted, so the element block knows that $207_1$ can report its match immediately. The OR gates 228 supplies the OR of the match_in signal from other element blocks (e.g., lower ID numbered blocks) with its own match signal 219 as a match_out signal 230 ($230_1$, $230_2$, $230_N$). The match_out signal from one element block is the match_in signal to another element block. If the match_in signal is asserted, the element block knows to wait to report its match until the match_in signal is deasserted.

Another aspect of the match logic and reporting logic in element block $207_1$ is represented by AND gate $227_1$. If match signal $219_1$ is asserted and match_in $225_1$ is deasserted (logic 0 in the illustrated embodiment) then the signal line $232_1$ is asserted notifying the final output sorting stage 223 of the match. The element block may toggle signal line $232_1$, and then place information regarding the matching element such as the value of the element stored in storage $209_1$ and the ID of the element block on the bus 231, which also may be stored in storage 209, and then toggle the same line again to indicate the information has been placed on the bus 231 telling the final output sorting stage 223 to read the information from the bus. After any element block places match information on the bus 231 and completes the second toggle of signal line $232_1$, the element block removes itself from further consideration in the sort operation by, e.g., setting the output voltage from DAC $211_1$ to a negative voltage or another voltage value that is lower (or higher for a sort starting with the lowest element) than the DAC 211 will generate for any other list element to be sorted. That may be accomplished by writing storage 209 with the equivalent lower (or higher) value for supplying to DAC 211. Thus, e.g., if all other elements in the remaining list to be sorted are represented by positive voltages, setting the voltage lower (to a zero or a negative value) for the matched element ensures the matched element will not be considered in future peak voltage determinations. The element block also ensures the match signal $219_1$ is deasserted.

Assume that the second element block $207_2$ has the same element value as the first element block $207_1$. If the second element block $207_2$ were to have the same matched voltage, it would observe the asserted match_in signal $230_1$ from the first element block $207_1$ and wait until that match_in signal $230_1$ is deasserted prior to sending its own match information to the bus 231. Assume, a third element block $207_k$ ($2<k\le N$) also has the same matched voltage. Element block $207_k$ knows about both the first and second circuit element matches from its match_in signal line and waits to output its match until its match_in signal line is deasserted.

In other embodiments collisions are dealt with using other common collision avoidance schemes that either avoid communication collisions or with mechanisms that tolerate such collisions and have automatic recovery mechanisms. For example, collisions may be detected and those element blocks trying to place information on bus 231 may, on detection of a collision, wait a random amount of time to retry to thereby reduce the likelihood of a second collision.

The sorting apparatus 200 may include programmed logic such as microcontrollers or processors to confer functionality, at least partially, to various components in the sorting apparatus 200 including element block 207, sequential loader 205, and final output sorting stage 223. In fact, the functionality of element block 207 may be implemented as a programmed microcontroller. For example, programmed logic may control the loading of storage 209, the reporting of matches, collision detection and avoidance, and any communication interfaces necessary to perform the functionality described. Thus, the AND and OR functions shown in the element block 207 may be implemented as part of the programmed logic. The analog logic for DAC 211 and comparator 217 may also be formed on the microcontroller. Further, software necessary to impart functionality to any programmed logic in element block 207 may be stored in storage 209 or another storage location in sorter 200.

Figure 3:
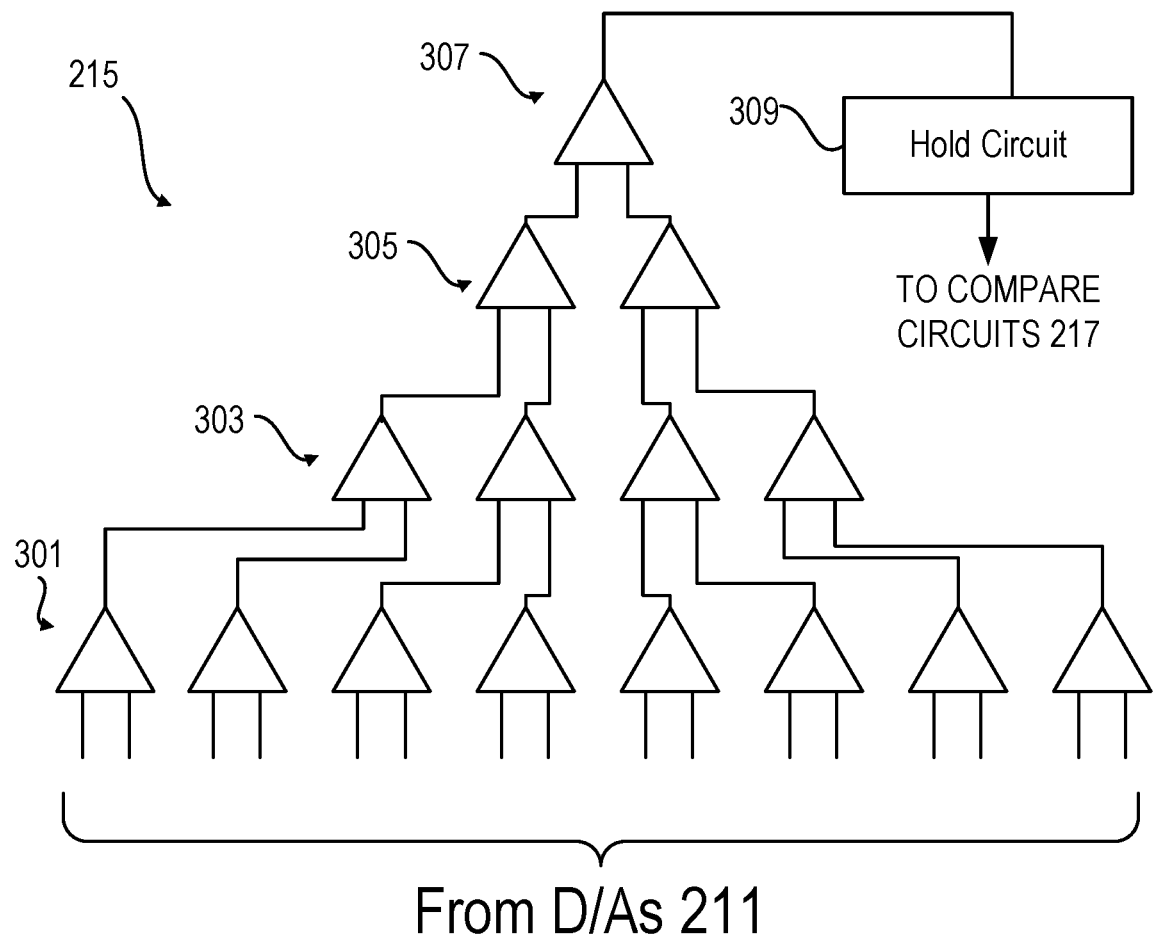
FIG. 3 illustrates a peak detect circuit according to an embodiment.

FIG. 3 illustrates a high level block diagram of peak detect and hold circuit 215. The example in FIG. 3 determines the peak of 16 inputs. For a larger number of inputs, more compare stages are used. The analog signals (assume voltages for FIG. 3) are supplied from the DACs 211 of element blocks 207. Each comparator in the first level 301 of the peak detect and hold circuit determines the larger voltage of the two inputs and supplies the larger voltage as an output to the next level of comparators 303. If two voltages are the same, either voltage may be passed to the output. The next level of comparators 303 compares the analog signals supplied from the first level 301 and generates four outputs. The third level of comparators 305 compares four analog signals from level 303 and supplies two outputs to the final level 307 that determines the peak voltage. The peak voltage may be held in a hold circuit 309, implemented, e.g., as capacitor circuit or other suitable analog storage circuit. That peak voltage is supplied to the comparators 217 to determine the matches described above. Note that one could sort smallest to largest instead of largest to smallest. In that case, each comparator in peak detector and hold circuit 215 would determine and supply the smallest of the voltages. Note also that the analog representation may be in voltage or current.

Figure 4:
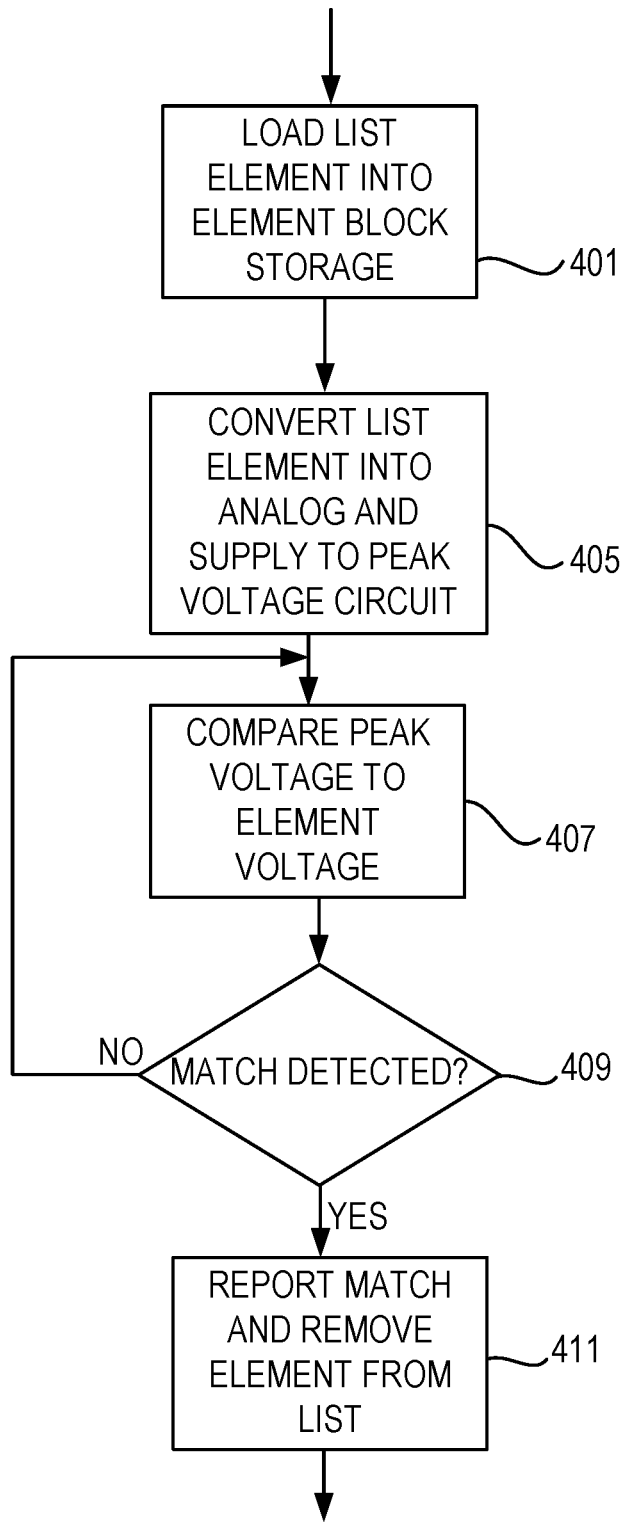
FIG. 4 illustrates a flow diagram associated with the embodiment of FIG. 2.

FIG. 4 represents a flow diagram of the operation of the sorter shown in FIG. 2 from the perspective of control logic for an element block. Note that the logical functions shown, e.g., the AND gates and OR gates, may be implemented as part of a programmed processor. Such a programmed processor may also control storage of the list element in storage 209, provide control to set the DAC output to negative responsive to a match, and perform match reporting. In 401 the unsorted list element, received from sequential loader 205 is loaded into the storage 209 of an element block 207. At 405, the element is converted to an analog signal in digital-to-analog converter (DAC) 211 and is supplied to the peak detect and hold circuit 215. At 407, the element block receives the peak voltage 208 from the peak detect and hold circuit 215 and compares the peak voltage and the element voltage from DAC 211 in comparator 217. When compared, the peak detect and hold voltage 208 and the element voltage from DAC 211 may not be exactly the same due to thermal noise and component tolerances, so the match signal 219 is asserted when the difference between the two voltages is less than a tolerance value. That tolerance value sets the sensitivity or resolution for detecting differences in values. The output of the match comparator 217 may be low-pass filtered to reduce thermal noise fluctuations, but the response time of the filter must still be fast enough to permit rapid changes in the peak detect and hold voltage as will occur during sorting. That implies a trade off between the noise reduction and overall speed of the sorting apparatus. Assume at the onset of processing that each independent element voltage arrives at the peak hold circuit at slightly different times. To avoid problems with matching voltages prior to the correct peak voltage being set, a brief time delay is applied at the start of processing before each element uses its comparator output to determine if it is producing the current peak voltage. Time delay differences may be measured in picoseconds or even in tens of nanoseconds depends on the source of the delay. Once each element sets its output voltage from DAC 211, that output voltage will remain constant until the element matches itself to a peak and removes itself from the contributing set. That implies that the peak hold voltage can only drop over time and those elements with highest voltages are serially removed. Every time a peak voltage is removed, a small delay is utilized to allow the new peak voltage to propagate through the peak detect and hold circuit and back to the comparators 217.

If no match is detected in 409, the element block takes no further action until the next element in the list is determined other than passing the OR of its match signal 219 with the match-in signal. If there is a match in 409, the element block supplies the match notification, assuming no collisions, to the final output sorting stage 223 and removes itself from subsequent compares by, e.g., setting its DAC to output a negative voltage. The block also deasserts its match signal 219 but continues to supply the match-in signal to other block elements through the match_out signal line. If there is a collision, the element block waits until it is free to report its match to the final output sorting stage. Assuming there are more elements to sort, the other element blocks continues the sorting operation and the sort returns to determining the peak voltage of the current set of elements and comparing the peak voltage to the voltages of the current set of elements. The process repeats until all the elements are sorted.

One aspect to consider is the usable dynamic ranges of voltages and therefore the resolution of numbers that can be represented. For example, the dynamic range could be $2^{14}$ voltage levels. That means that the sorter can distinguish between 4096 voltages. Such a range works well for applications that desire the input elements to be sorted into, e.g., 4096 buckets. Thus, even though each list element may be, for example, 64 bits long, only the 14 most significant bits may be converted to analog so that each element is sorted into one of 4096 buckets. Many applications only require the granularity provided by such a rough sort into various buckets.

Note that the generation or comparison of voltages involves electrical noise, so there is a possibility that two voltages that are very close together may not be sorted properly because the difference between two voltages is less than the electrical noise level. When any element block 207 detects a voltage match between itself and the peak voltage, the element block sends the digital value of the list element it is processing to the final output sorting stage. That final output sorting stage may correct for sorting errors caused by the electrical noise by performing a final sort prior to appending to the final sorted list 206.

In some embodiments, the final sort is not performed. In others, the final output sort affects only some of the list elements. For example, assume four numbers to be sorted have values of 1.0, 1.1, 1.2, and 5. Those values are converted by the DACs into voltages a, b, c, and d but those voltage values include up to 0.11 volts of random noise. Let us say the voltages a, b, c, and d, with noise, are 1.1V, 0.99V, 1.2V, and 4.9V, respectively. The order of the two values, originally 1.0 and 1.1, are swapped due to noise. The sorter determines the peak voltage of the four numbers be 4.9 volts. Each comparator 217 in the element blocks 207 compares itself to 4.9 V and one match is found. The element block with the match sends its original digital value of 5.0 to the final output sorting stage 223. The element block processing the element 5.0 removes itself from further consideration by the peak hold circuit (by, e.g., setting the voltage out of the DAC to be negative). On the next peak determination, the new peak drops to 1.2 V. The final sorting stage retains 5.0 until another value arrives, because the next value could be very close and might require final sorting. The next value supplied to the final stage is 1.2. The value 1.2 is compared to the value 5.0 and is observed to be lower and is placed below the value 5.0 in a numeric stack. The final sorting stage then computes the difference between the largest and smallest value in the stack and if the difference is larger than a digital value associated with the known noise level of the voltages, e.g., twice the noise level, then no new incoming values are likely to be larger, therefore the top value in the stack, 5, is sent to the sorted output list 206.

At this point, the value 1.2 becomes the largest value in the stack. When the next value, being 1.0 comes into the final sorting stage, the difference from 1.2 is less than twice the noise level and the value 1.2 is not moved to the final sorting list. Instead, both values are kept in the final output sorting stage. Nonetheless, the value 1.0 is placed lower in the stack than 1.2 in rank order. When the value 1.1 is received, it is placed between 1.2 and 1.0 in rank order. Thus, the final sorting stage may utilize an additional sort for those values that are sufficiently close together. Thus, the insertion sort may be performed but only for those values having a difference less than a threshold associated with the noise error. After the three remaining numbers have been sorted, since no more values exist to be sent to the final sorting stage, the final sorting stage sends its rank-ordered final values out to the sorted output list.

Note that the extra sort performed by the final output sorting stage is optional. In other embodiments, the final sorted values are sent to the final sorted list as they come out of the analog sorter. For some applications, the categorizing of list items into buckets (e.g., having a 14 bit resolution) is the important function, not necessarily the specific order within the bucket and errors within the noise margin are tolerable.

Thus, embodiments of the analog sorter provide a rough sort to within the dynamic range of the voltage comparison circuitry and the final sorting stage may be used to clean up the noise. At one extreme, if every value in the list is spaced farther apart than two times the noise in the circuitry, then the final sorting stage never has more than two values in it. The difference between the two values always triggers sending the larger one out to the output list. At the other extreme, if every single value in the list is within the noise, the apparatus provides no sorting advantage because every value would be in the final output sorter before any list elements could be sent to the output list.

The size of the final output sorting stage 223 may be smaller than the size of the list. If the final sorting stage is compelled to load more values than its size in an embodiment, then the final output sorting stage behaves as a first in first out (FIFO) buffer and sends values to the final sorted list along with a flag indicating there is risk in the sorting order within the voltage tolerance. The flags indicate the sort may have errors, and may need to undergo another level of sorting depending on the needs of the requesting computer system. Since the noisy list elements in the sorted output list can be identified (those having a difference with another element that is less than the noise threshold), the requesting computer system may be able to determine that the sorting is sufficient for its purposes.

Figure 5:
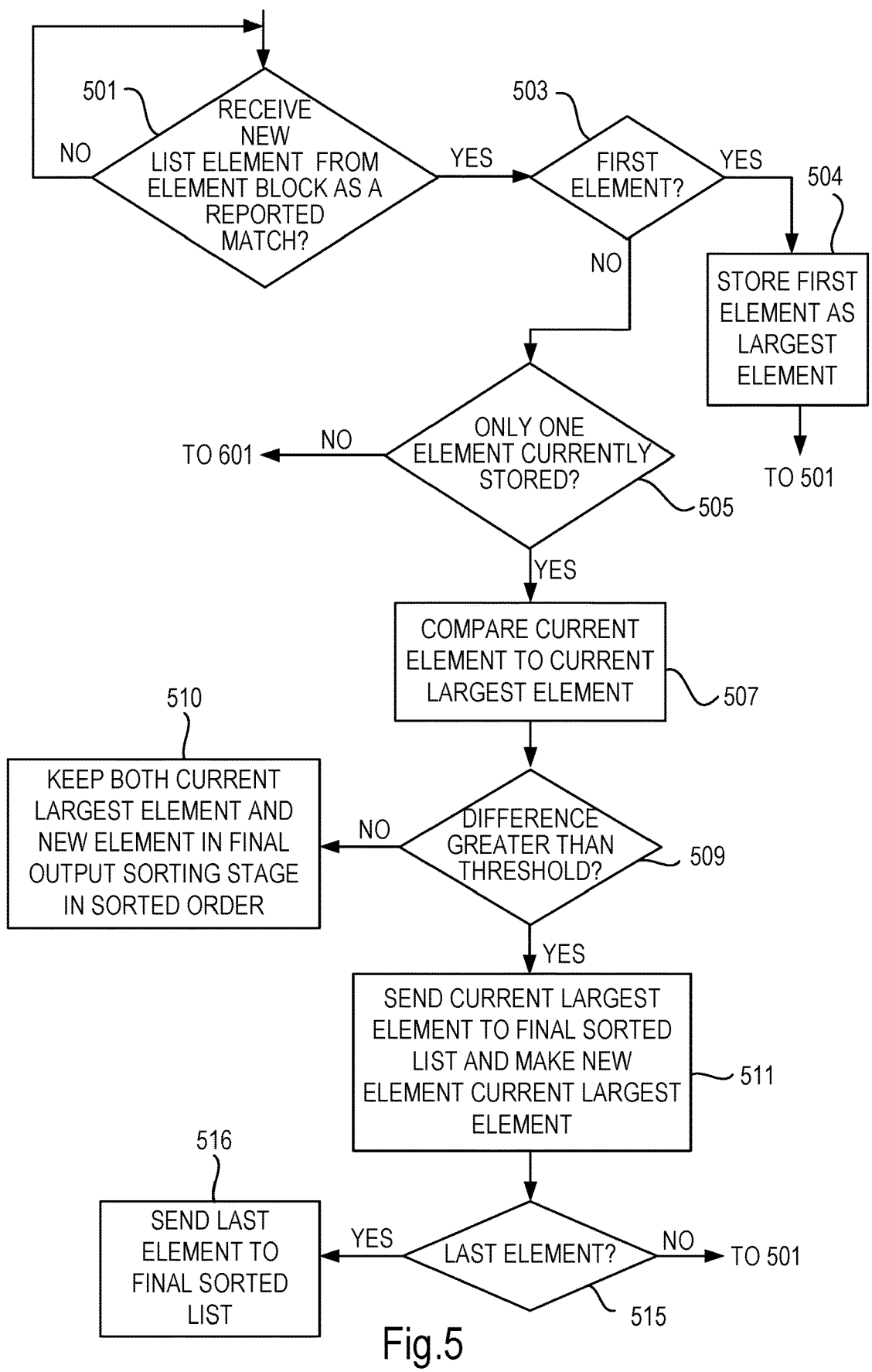
FIG. 5 illustrates a flow diagram associated with the final output sorting stage.

The final output sorting stage 223 may be implemented using programmed logic such as a processor 226 and includes memory 228 necessary for storing reported matches and final sorting and storing any software necessary for receiving matches, final sorting, and providing outputs to the final sorted list. In fact, the final sorted output list 206 may be implemented as part of the output sorting stage. Referring to FIG. 5, a flow chart illustrates operation of the final output sorting stage. In 501 the final output sorting stage waits to receive a new list element from one of the element blocks when a match is detected by one of the element blocks. When a match is received, if it is determined to be the very first element of the list in 503, the final output sorting stage stores the largest (or smallest) list element and returns to wait for the next match in 501. Assuming it is not the first element, the final output sorting stage determines if there is only one element stored (the current largest element) in 505. If there is only one element stored, the new element from the most recently received match, is compared to the largest element in 507. If the difference is greater than the threshold, such as when 5 was compared to 1.2, the current largest element is sent to the final sorted list and the new element is made the current largest element in 511. In 515, if it is the last element, then the last element is sent to the final sorted list in 516. If it is not the last element, the flow returns to 501 to wait for another match.

If the difference is not greater than the threshold in 509, then in 510 both the new element and the current largest element are kept in the final output sorting stage in sorted order.

Figure 6:
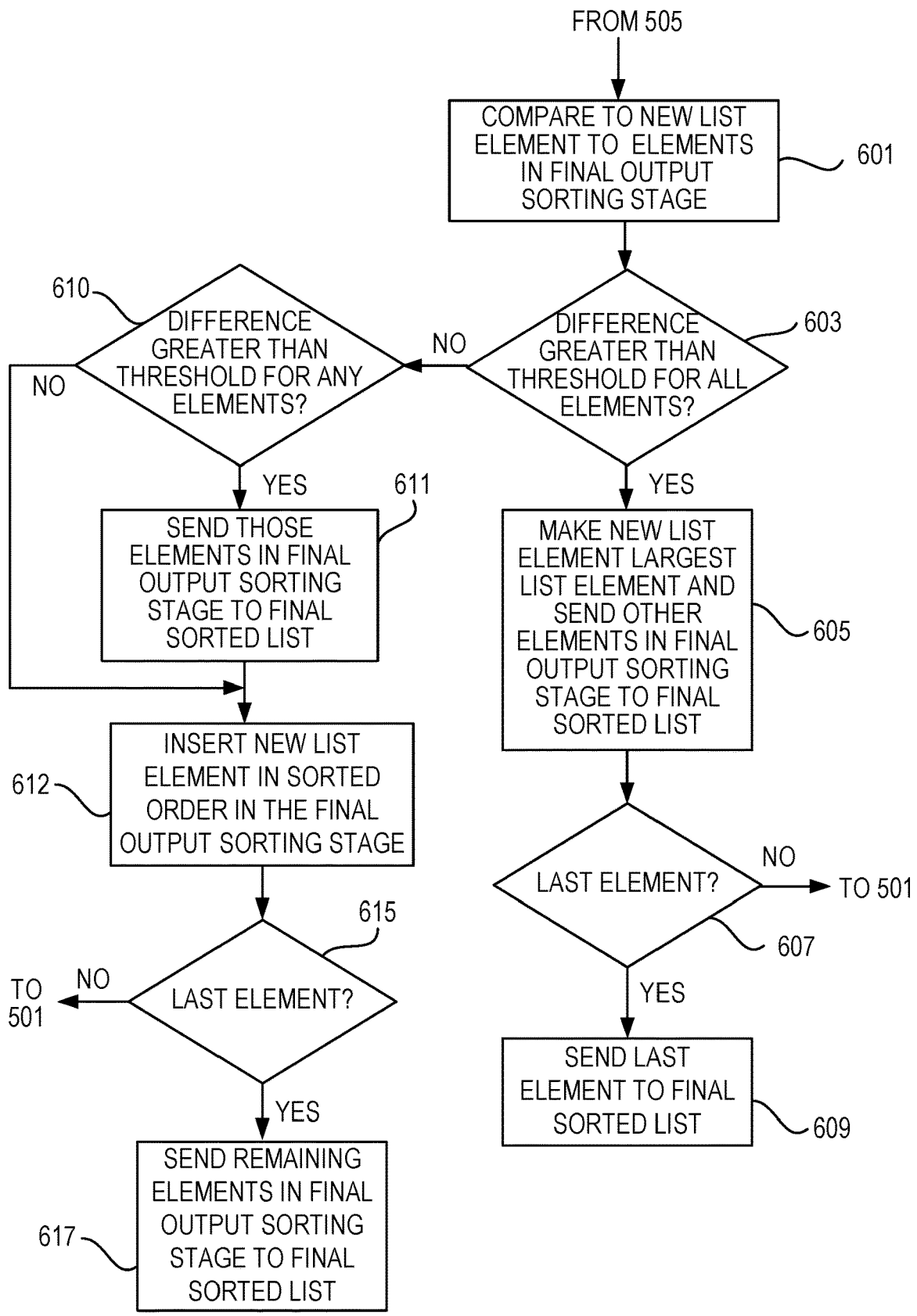
FIG. 6 illustrates another flow diagram associated with the final output sorting stage.

If in 505 it is determined that there is more than one element stored in the final output sorting stage because the values currently stored are too close in value, then the flow proceeds to 601. Referring to FIG. 6, the new list element is compared to the elements in the list. For example, assume the elements in the final output sorting stage for additional sorting are 12, 11.5, and 11.2 and the threshold is 1. Assuming the new element value is 8. Since the differences between all the values and the new element are above the threshold, in 605 the new element 8 is made the largest element in the final output sorting stage and the other three elements (12, 11.5, and 11.2) are sent to the final sorted list. If the new element is not the last element in 607, the flow returns to 501 to wait for the next match. If it is the last element, the last element is sent to the final sorted list in 609.

In 603, if the differences between the new element and all the element values are not greater than the threshold, e.g., if the new element value was 10.2, then in 610, if the new element differs from one or more of the existing elements by more than the threshold, those one or more elements are sent to the final output sorting stage and the new element is inserted in the final output sorting stage in rank order in 612. In this case, since 10.2 differs from 12 and 11.5 by more than the threshold value of 1.0, in 611 those elements (12 and 11.5) are sent to the final sorted list and 10.2 is inserted below 11 in the final output sorting stage in rank order. If the answer is no in 610, e.g., the new element value is 11, the new element is inserted in the final output sorting stage in rank order in 612. A check is made in 615 to see if the new element is the last element and if not, the flow returns to 501. If yes, the remaining elements in the final output sorting stage are sent to the final sorted list in 617.

It is useful to note that not all lists need to be perfectly sorted. Consider an example where the "yellow pages" is sorted within plus or minus three positions. One could merely find a desired value and then look within plus or minus three positions for a better match. That rough sort lends itself to a field of computational sorting referred to herein as statistical sorting. That is to say, sorting lists roughly where the roughness is specified and one can make tradeoffs between how much computational effort is expended on a perfect sort versus an approximate sort which can then be resolved at the time the information is needed to address a specific problem. To the extent one has some information about the distribution of the list values, one can predict the effectiveness of the vector magnitude sorter.

The benefit of the disclosed invention is the ability to reduce the number of compare operations from N log 2(N) to something closer to N for well distributed list of numbers. When sorting very large datasets, the savings in process effort is roughly log 2(N). When processing LISTs of 1 million values, the computational effort is reduced by 95%. With LISTs of 1 trillion values, the reduction in computation in closer to 97.5%. The end result is that data and processing centers could greatly reduce the number of servers deployed for processing.

Thus, aspects of an analog sorter to implement a spaghetti sort have been described. The description set forth herein is illustrative, and is not intended to limit the scope of the following claims. Variations and modifications of the embodiments disclosed herein may be made based on the description set forth herein, without departing from the scope and spirit of the following claims.

What is claimed is:

1. A sorting apparatus comprising:
    a sequential loader to load elements of a list to be sorted into a respective plurality of list element blocks;
    each of the list element blocks including,
        a digital storage to store a digital element value of a list element that has been loaded;
        a digital to analog converter to convert the digital element value into an analog signal;
        an analog comparator to compare the analog signal to a peak analog signal and supply a match signal indicative thereof, wherein the analog comparator asserts the match signal when the analog signal matches the peak analog signal; and
    a peak detect and hold circuit coupled to receive analog signals from the list element blocks, determine the peak analog signal therefrom, and to supply the peak analog signal to the analog comparators of the list element blocks.

2. The sorting apparatus as recited in claim 1, wherein the analog signals are voltages.

3. The sorting apparatus as recited in claim 1, wherein each of the list element blocks, responsive to the match signal being asserted, set the analog signal supplied from the digital to analog converter to a negative voltage value.

4. The sorting apparatus as recited in claim 3, wherein the analog signal is set to a negative voltage value by writing the digital storage.

5. The sorting apparatus as recited in claim 1, further comprising:
    an output sorting stage coupled to the list element blocks; and
    wherein the list element blocks report matches to the output sorting stage.

6. The sorting apparatus as recited in claim 5, wherein information associated with reported matches include a digital list element value and an identification of a reporting list element block.

7. The sorting apparatus as recited in claim 5,
    wherein the output sorting stage is configured to determine a difference between a newly reported match list value and a current maximum stored list value stored in the output sorting stage; and
    wherein the output sorting stage is responsive to the difference being above a threshold, to supply the current maximum stored list value to a final sorted list and make the newly reported match list value the current maximum stored list value.

8. The sorting apparatus as recited in claim 5,
    wherein the output sorting stage is configured to determine a difference between a newly reported match list value to a current maximum stored list value stored in the output sorting stage; and
    wherein the output sorting stage is responsive to the difference being below a threshold, to maintain the current maximum stored list value the newly reported match list value in sorted order in the output sorting stage.

9. The sorting apparatus as recited in claim 3, wherein each of the list element blocks is coupled to receive a match input signal indicative of matches of other list element blocks having a higher priority in reporting matches.

10. The sorting apparatus as recited in claim 9, wherein each of the list element blocks includes an OR function to logically OR the match input signal with the match signal and supply a match out signal.

11. The sorting apparatus as recited in claim 10, wherein each of the list element blocks is responsive to report a match when the match input signal is deasserted and the match signal is being asserted.

12. A method comprising:
    receiving list elements of a list to be sorted;
    loading the list elements into respective list element blocks;
    converting the list elements to respective analog signals;
    comparing the respective analog signals to determine a first largest analog signal;
    comparing the first largest analog signal to the respective analog signals to determine which one or more respective analog signals matches the first largest analog signal;
    removing the one or more of the respective analog signals that match the first largest analog signal to generate remaining analog signals;
    comparing the remaining analog signals to determine a second largest analog signal;
    comparing the second largest analog signal to the remaining analog signals to determine which one of more of the remaining analog signals matches the second largest analog signal; and
    removing the one or more of the remaining analog signals that match the second largest analog signal to generate second remaining analog signals.

13. The method as recited in claim 12 further comprising;
    generating the analog signals in a respective plurality of digital-to-analog converters; and
    supplying the analog signals to an analog peak detect and hold circuit to determine the first largest analog signal.

14. The method as recited in claim 12, further comprising:
    removing the one or more of the respective analog signals that match the first largest analog signal to generate remaining analog signals by setting the one or more respective analog signals to a value outside a valid range to represent the list elements.

15. The method as recited in claim 13, further comprising:
logically ORing a match signal generated by a comparator of a particular list element block and an input match signal indicating whether other matches exist.

16. The method as recited in claim 12, wherein only a predetermined number of most significant bits of the list elements are converted to the respective analog signals.

17. The method as recited in claim 12, further comprising:
reporting the one of the respective analog signals that match the first largest analog signal to a final output sorting stage as a first reported match; and
reporting the one of the remaining analog signals that match the second largest analog signal to the final output sorting stage as a second reported match.

18. The method as recited in claim 17, further comprising:
determining a digital difference between the first reported match and the second reported match;
if the digital difference is less than a threshold value, keeping the first reported match and the second reported match in the final output sorting stage for further sorting; and
if the digital difference is greater than the threshold value, supplying the first reported match to a final sorted list;
wherein the threshold value corresponds to a noise value associated with the sorting.

19. A method of sorting comprising:
comparing a plurality of analog signals corresponding respectively to elements of a list to be sorted;
selecting, based on the comparing, one of the analog signals;
determining one or more matches by comparing the one of the analog signals to each of the analog signals to determine which one or more of the analog signals to match the one of the analog signals;
removing from the plurality of analog signals the one or more of the analog signals that match; and
repeating the comparing, selecting, and determining until all of the plurality of analog signals have been sorted.

20. The method as recited in claim 19 wherein the one of the analog signals is selected based on the one of the analog signals being a maximum or a minimum of the plurality of analog signals.

* * * * *